US012693155B2

(12) United States Patent
Melsheimer

(10) Patent No.: US 12,693,155 B2
(45) Date of Patent: Jul. 28, 2026

(54) DIFFRACTION-BASED ILLUMINATION SAMPLING

(71) Applicant: KLA Corporation, Milpitas, CA (US)

(72) Inventor: Florian Melsheimer, Cologne (DE)

(73) Assignee: KLA Corporation, Milpitas, CA (US)

( * ) Notice: Subject to any disclaimer, the term of this patent is extended or adjusted under 35 U.S.C. 154(b) by 161 days.

(21) Appl. No.: 18/814,052

(22) Filed: Aug. 23, 2024

(65) Prior Publication Data

US 2025/0198836 A1 Jun. 19, 2025

Related U.S. Application Data

(60) Provisional application No. 63/609,889, filed on Dec. 14, 2023.

(51) Int. Cl.
*G01J 1/42* (2006.01)
*G02B 27/09* (2006.01)
*G03F 7/00* (2006.01)

(52) U.S. Cl.
CPC .......... *G01J 1/429* (2013.01); *G02B 27/0927* (2013.01); *G02B 27/0944* (2013.01); *G02B 27/0983* (2013.01); *G03F 7/70158* (2013.01); *G03F 7/702* (2013.01); *G03F 7/70575* (2013.01); *G03F 7/7085* (2013.01)

(58) Field of Classification Search
CPC . G01J 1/429; G02B 27/0927; G02B 27/0944; G02B 27/0983; G03F 7/70158; G03F 7/702; G03F 7/70575; G03F 7/7085
See application file for complete search history.

(56) References Cited

U.S. PATENT DOCUMENTS

| | | | |
|---|---|---|---|
| 6,347,176 B1 | 2/2002 | Hawryluk et al. | |
| 8,553,217 B2 | 10/2013 | Chuang et al. | |
| 9,671,548 B2 | 6/2017 | Wald et al. | |
| 2007/0242924 A1 | 10/2007 | Cianciotto et al. | |
| 2008/0117531 A1* | 5/2008 | Asper ................ | G02B 27/0927 |
| | | | 359/741 |
| 2013/0321808 A1 | 12/2013 | Comstock et al. | |
| 2014/0151580 A1 | 6/2014 | Wang et al. | |
| 2017/0248794 A1* | 8/2017 | Eurlings ............. | G03F 7/70616 |
| 2018/0149523 A1* | 5/2018 | Zhao ..................... | G03F 7/7085 |

(Continued)

OTHER PUBLICATIONS

Bahrenberg et al., "Analysis of distinct scattering of extreme ultraviolet phase and amplitude multilayer defects with an actinic dark-field microscope," Extreme Ultraviolet (EUV) Lithography VI, Proc. of SPIE vol. 9422, 942229 (Mar. 13, 2015).

(Continued)

*Primary Examiner* — Mark R Gaworecki
(74) *Attorney, Agent, or Firm* — Hodgson Russ LLP

(57) ABSTRACT

An illumination system may include an optical homogenizer to homogenize a beam of light and a grating positioned in a path for the homogenized beam of light, to diffract light from the homogenized beam. The illumination system also includes a detector to receive light diffracted by the grating and to measure a power of the received light. The grating is disposed, for example, on an inner surface of the optical homogenizer or on a surface of a focusing mirror. Alternatively, the grating is disposed on the surface of the focusing mirror and the optical homogenizer is omitted from the illumination system.

20 Claims, 6 Drawing Sheets

(56) References Cited

U.S. PATENT DOCUMENTS

| | | | | |
|---|---|---|---|---|
| 2018/0276812 | A1 | 9/2018 | Kohyama et al. | |
| 2020/0341194 | A1 | 10/2020 | Waldern et al. | |
| 2023/0017619 | A1 | 1/2023 | Ni et al. | |
| 2023/0144290 | A1* | 5/2023 | Liu | G03F 7/7085 |
| | | | | 356/519 |
| 2023/0194348 | A1* | 6/2023 | Liu | G01J 3/26 |
| | | | | 356/328 |

OTHER PUBLICATIONS

Holographix LLC, "Large Area Ion Beam Milling," Sep. 22, 2023, http://web.archive.org/web/20230922202730/https://holographix. com/large-area-ion-beam-milling/.
Holographix LLC, "Mastering," Sep. 22, 2023, http://web.archive. org/web/20230922215655/https://holographix.com/mastering/.
Huang et al., "Multi-value phase grating fabrication using direct laser writing for generating a two-dimensional focal spot array," J. Opt. 24 (2022) 055601.
Palmer, Diffraction Grating Handbook, ch. 2: "The Properties of Diffraction Gratings," pp. 19-38 (8th ed., 2020).
Rihacek et al., "Beam shaping and probe characterization in the scanning electron microscope," Ultramicroscopy 225 (2021) 113268.
Wang et al., "Mechanical Ruling of Diffraction Grating—Part II: Experimental Investigation and Numerical Simulation," Proceedings of the ASME 2016 International Manufacturing Science and Engineering Conference (Jun. 2016), DOI:10.1115/MSEC2016-8715.
PCT/US2024/056439, International Search Report, Mar. 4, 2025.
PCT/US2024/056439, Written Opinion of the International Searching Authority, Mar. 4, 2025.

* cited by examiner

400

DIFFRACTION-BASED ILLUMINATION SAMPLING

RELATED APPLICATION

This application claims the benefit of U.S. Provisional Patent Application No. 63/609,889, filed on Dec. 14, 2023, which is incorporated by reference in its entirety for all purposes.

TECHNICAL FIELD

This disclosure relates to measuring illumination, and more specifically to sampling light in the illumination beam path of an illumination system using diffraction.

BACKGROUND

Various techniques exist for sampling light in an illumination beam path. Beam splitters may be used to divert a fraction of light to a sensor that measures the power of the light. For certain spectral ranges such as extreme ultraviolet (EUV) (e.g., 13.5 nm wavelength light), however, no suitable beam splitters exist. Any beam splitter for other wavelengths needs to withstand the full beam power and may be subject to degradation over time.

One or more mirrors may be used to deflect a spatial fraction of a beam's light to a sensor. Or instead of using one or more mirrors, a sensor that protrudes into the beam may be directly illuminated. Mirrors that deflect the light or sensors that directly sample the light should be precisely aligned. Such mirrors or sensors are also exposed to high irradiance and a high dose of light over their lifetime and are thus subject to degradation or contamination. Furthermore, any space in the field plane that is occupied by mirrors or sensors is not available for downstream application. Minimizing the size of mirrors or sensors is also challenging from a manufacturing perspective.

A gas cell that detects ionization of gas present in the cell may be used. The level of ionization relates to the energy of light passing through the cell. But gas cells provide very low signals, have poor efficiency, and provide no spatial resolution. Transmissive and conductive thin films may be used that emit photocurrent when light passes through them. The photocurrent is related to the amount of light passing through the film. But such thin films have large losses and low transmission for EUV. Such thin films also are subject to severe degradation and are not feasible for high-power setups.

SUMMARY

Accordingly, there is a need for techniques to sample the in-band (IB) field brightness in the illumination beam path of an illumination system. The IB illumination may be EUV light (e.g., with a 13.5 nm wavelength) or may have other wavelengths. For example, the IB illumination may be deep ultraviolet (DUV) light with wavelengths in the 280-200 nm range, vacuum ultraviolet (VUV) light with wavelengths in the 200-100 nm range, or soft x-rays (SXR) with wavelengths in the range of 6 nm down to the lower end of the so-called water window at approximately 2.3 nm. Examples of applications for the illumination system include manufacturing inspection (e.g., reticle or semiconductor wafer inspection) and photolithography.

In some embodiments, an illumination system includes an optical homogenizer to homogenize a beam of light and a grating positioned in a path for the homogenized beam of light, to diffract light from the homogenized beam. The illumination system also includes a detector to receive light diffracted by the grating and to measure a power of the received light.

In some embodiments, a method includes homogenizing a beam of light and diffracting light from the homogenized beam, using a grating positioned in a path for the homogenized beam. The method also includes measuring a power of the diffracted light.

In some embodiments, an illumination system includes a focusing mirror to focus an unhomogenized beam of light and a grating, disposed on a surface of the focusing mirror, to diffract light from the beam. The illumination system also includes a detector to receive light diffracted by the grating and to measure a power of the received light.

In some embodiments, a method includes focusing an unhomogenized beam of light using a focusing mirror. The method also includes diffracting light from the beam using a grating disposed on a surface of the focusing mirror. The method further includes measuring a power of the diffracted light.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
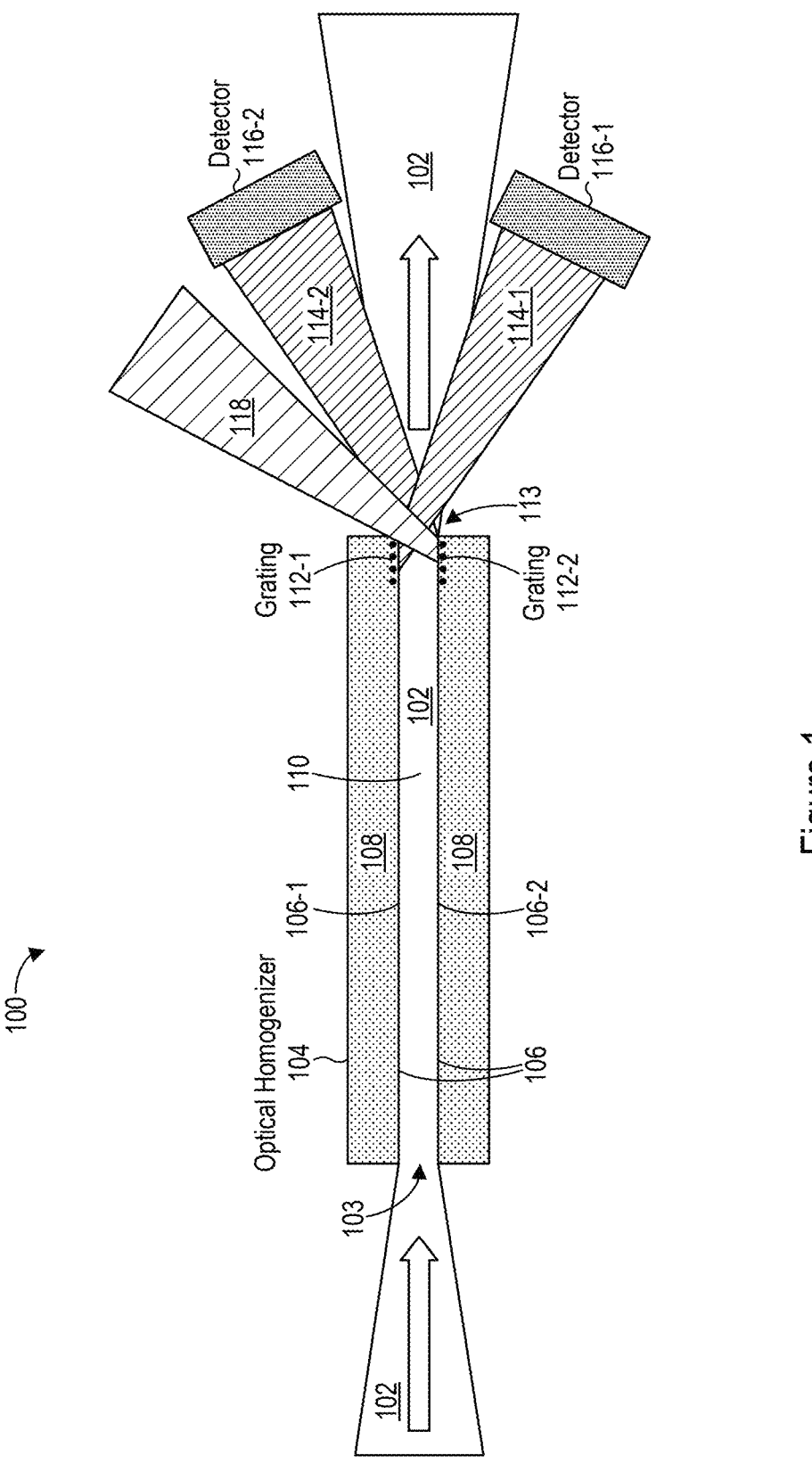
FIG. 1 shows a portion of an illumination system with an optical homogenizer, gratings, and detectors, in accordance with some embodiments.

FIG. 1 shows a portion of an illumination system 100 in accordance with some embodiments. The illumination system 100 is used to illuminate a target (not shown). For example, the target may be a reticle (i.e., photomask) or semiconductor wafer that is illuminated to inspect the target for defects. In another example, the target is a semiconductor wafer that is illuminated to expose the wafer during a photolithographic manufacturing process.

In an illumination path of the illumination system 100, a beam of light 102 is provided to an optical homogenizer 104. The beam 102, as provided to the optical homogenizer 104 (i.e., before entering the optical homogenizer 104 and as it enters the optical homogenizer 104) is spatially unhomogenized: the energy distribution of light in the beam 102 varies across the beam 102 and is thus uneven. For example, the light in the beam 102 may have a Gaussian or Lorentzian energy distribution. The optical homogenizer 104 homogenizes the beam 102, evening out the spatial energy distribution of the light in the beam 102.

In some embodiments, the beam 102 is a beam of extreme ultraviolet (EUV) light. For example, the beam 102 includes EUV light with a 13.5 nm wavelength (e.g., for use in semiconductor processing or metrology), as generated by an EUV light source (not shown). The EUV light (e.g., 13.5 nm light) is referred to as being in-band (IB), because it is the desired band of light for the application in which the beam 102 is used. EUV light sources do not produce beams of pure IB EUV light, however, but instead produce beams that also include out-of-band (OOB) light with longer wavelengths than the wavelength of the EUV light. The beam 102 thus may include OOB light in addition to the IB EUV light. The OOB light in the beam 102 may include ultraviolet, visual, and infrared light. For example, the OOB light in the beam 102 may include light with wavelengths ranging from approximately 50 nm to approximately 1000 nm.

In some embodiments, the optical homogenizer 104 has sides 108 with reflective inner surfaces 106 to reflect the light in the beam 102 (e.g., to reflect the IB EUV light and the OOB light). The inner surfaces 106 define (i.e., form) a tunnel 110 with a first end 103 and a second end 113. The tunnel 110 extends through the optical homogenizer 104. The first end 103 is an opening into the tunnel 110 (i.e., an entrance to the tunnel 110) and the second end 113 is an opening out of the tunnel 110 (i.e., an exit to the tunnel 110). The tunnel 110 may be rectangular, with four sides 108 and four corresponding inner surfaces 106. FIG. 1 shows a cross-sectional side view of this configuration of the tunnel, such that two sides 108 are visible in FIG. 1. The inner surfaces 106 may be coated with a reflective material (e.g., ruthenium (Ru) or another reflective material) to make them reflective to the IB EUV light as well as the OOB light. For example, the sides 108 may be silicon strips with inner surfaces 106 coated with a reflective material (e.g., Ru-coated inner surfaces 106). In another example, the sides 108 are nickel with inner surfaces 106 coated with a reflective material (e.g., Ru-coated inner surfaces 106).

The beam 102 is directed into the tunnel 110 through the first end 103 of the tunnel 110 (e.g., is focused onto the first end 103). The beam 102 thus enters the tunnel 110 at the first end 103. The beam 102 propagates through the tunnel 110 and exits the tunnel 110 at the second end 113. While propagating through the tunnel 110, light in the beam 102 is repeatedly incident on and reflected by the inner surfaces 106. This repeated reflection homogenizes the beam 102 by the time the beam 102 reaches the second end 113 of the tunnel 110, providing the beam 102 with a substantially uniform spatial energy distribution.

The main beam 102 propagates onward (e.g., toward the target) after exiting the second end 113 of the tunnel 110. A portion of the light in the homogenized beam 102 is diffracted, however, by a first grating 112-1 and a second grating 112-2 disposed on respective inner surfaces 106 of the optical homogenizer 104 at the second end 113 of the tunnel 110. The first grating 112-1 is disposed on a first inner surface 106-1 of the optical homogenizer 104 and the second grating 112-2 is disposed on a second inner surface 106-2 of the optical homogenizer 104. Because the first and second gratings 112-1 and 112-2 are disposed at the second end 113 of the tunnel 110, the light in the beam 102 is homogenized by the time it reaches the first and second gratings 112-1 and 112-2. In this manner, the first grating 112-1 and the second grating 112-2 are positioned in a path for the homogenized beam 102, to diffract light from the homogenized beam 102. The first and second gratings 112-1 and 112-2 are considered to be at the second end 113 of the tunnel 110 in the sense that they are close enough to the second end 113 of the tunnel 110 to allow diffracted light to exit the second end 113. The specular reflection (i.e., zeroth order light) from the first grating 112-1 and the second grating 112-2 exits the tunnel 110 at the second end 113 and propagates onward in the main beam 102, and is thus available for downstream application (e.g., for metrology or photolithography).

A first detector 116-1 is positioned to receive light 114-1 diffracted by the first grating 112-1. The first detector 116-1 measures the power of the received light 114-1. A second detector 116-2 is positioned to receive light 114-2 diffracted by the second grating 112-2. The second detector 116-2 measures the power of the received light 114-2. The first detector 116-1 and the second detector 116-2 may be photodiodes or other suitable optical sensors. The power of the received light 114-1 and 114-2 can be compared to expected power values to determine whether the illumination system 100 is operating properly. The power of the received light 114-1 and 114-2 can serve as feedback to adjust operation of the illumination system 100 (e.g., of the light source in the illumination system 100).

In some embodiments, the light 114-1 diffracted by the first grating 112-1 and received by the first detector 116-1 is a particular diffraction order of IB EUV light (e.g., the first diffraction order), and the light 114-2 diffracted by the second grating 112-2 and received by the second detector 116-2 is also the particular diffraction order of the IB EUV light (e.g., also the first diffraction order). (The term "first" as used herein in the context of diffraction orders is not an arbitrary label but instead refers to a specific diffraction order.) The first and second detectors 116-1 and 116-2 measure respective powers of the particular diffraction order of the IB EUV light. The first and second gratings 112-1 and 112-2 may also diffract OOB light. FIG. 1 shows a particular diffraction order of OOB light 118 (e.g., the first diffraction order) generated by the second grating 112-2. Similarly, diffraction orders including a first diffraction order of OOB light (not shown for simplicity) are generated by the first grating 112-1. Because the gratings 112-1 and 112-2 are dispersive, the particular (e.g., first) diffraction order of OOB light 118 is diffracted at different angles than the IB EUV light 114-1 and 114-2 in the same diffraction order. The IB EUV light 114-1 and 114-2 as received and measured by the first and second detectors 116-1 and 116-2 therefore has high spectral purity. Accordingly, the first and second detectors 116-1 and 116-2 are implemented without positioning spectral filters in front of them, in accordance with some embodiments. Alternatively, the first and second detectors 116-1 and 116-2 are implemented with respective filters disposed in front of them to filter out stray light (e.g., stray OOB light).

In some embodiments, the gratings 112-1 and 112-2 are formed in the respective inner surfaces 106-1 and 106-2 at the second end 113 of the tunnel 110 using subtractive manufacturing. For example, grating spaces may be formed using laser scribing, mechanical ruling, focused ion beam milling, lithographic patterning, etching, or stamping. Alternatively, the gratings 112-1 and 112-2 are formed by adding material (e.g., for grating lines) to the inner surfaces 106-1 and 106-2 at the second end 113 of the tunnel 110 using thin-film manufacturing techniques. For example, lines of tantalum nitride, which acts as an EUV absorber, are added to the inner surfaces 106-1 and 106-2. In another example, lines of zirconium, which phase-shifts EUV light, are added to the inner surfaces 106-1 and 106-2.

The gratings 112-1 and 112-2 are designed to provide the diffracted light 114-1 and 114-2 with a large enough angle relative to the main beam 102 to allow the detectors 116-1 and 116-2 to receive the diffracted light 114-1 and 114-2 without receiving the main beam 102. The gratings 112-1 and 112-2 may be a linear grating with constant or varying line spacing, a blazed grating, a two-dimensional array of dots, or another dispersive pattern. The gratings 112-1 and 112-2 may provide amplitude and/or phase modulation.

Because the beam 102 propagates through the tunnel 110 and because the gratings 112-1 and 112-2 are disposed on inner surfaces 106 of the tunnel 110, light in the beam 102 is incident on the gratings 112-1 and 112-2 at glancing angles. For example, assuming a linear binary grating 112-1 or 112-2 etched into an inner surface 106 of the optical homogenizer 104, the spacing of the grating lines (i.e., bars) determines the angle at which a diffraction order of the IB EUV light is diffracted. Using the well-known grating equation, for a grating line spacing of 1000 lines/mm, an average angle of incidence of light in the beam 102 on the grating 112-1 or 112-2 of 1°, and an EUV wavelength of 13.5 nm, the first diffraction order of the 13.5 nm light 114-1 or 114-2 is diffracted at an angle of approximately 9.5° from the plane of the grating 112-1 or 112-2. A larger line spacing of 400 lines/mm would result in a smaller diffraction angle of 4° from the grating plane. The line spacing is chosen so that the utilized diffraction order sufficiently separates from the main beam 102 where the detector 116-1 or 116-2 is placed. For example, with a detector 116-1 or 116-2 placed 30 mm away from the grating 112-1 or 112-2, the separation of the spot for the first-order diffracted IB EUV light 114-1 or 114-2 and the main beam 102 is approximately 5 mm for a line spacing of 1000 lines/mm or 3.2 mm for a spacing of 400 lines/mm.

With a linear grating, the diffracted light (e.g., light 114-1 or 114-2) spreads out with the same divergence as the main beam 102, reducing irradiance at the detector. Another way to tailor the power of the diffracted beam is to scale the length or width of the patterned area of the grating 112-1 or 112-2. A smaller area reduces the amount of light reaching the detector 116-1 or 116-2, while a larger area increases the amount of light reaching the detector 116-1 or 116-2. Another tunable parameter may be the ratio of line (i.e., bar) width to the spacing (i.e., groove) width. Any ratio deviating from 1:1 (in the case of a binary amplitude grating) reduces the power in the diffraction order. Reducing the power in the diffraction order (i.e., reducing the amount of light 114-1 or 114-2 reaching the detector 116-1 or 116-2 and thus reducing irradiance of the detector 116-1 or 116-2) reduces degradation and contamination for the detector 116-1 or 116-2, thereby increasing the operating lifetime of the detector 116-1 or 116-2.

In the example of FIG. 1, there are two gratings 112-1 and 112-2 in the illumination path of the illumination system 100. Alternatively, either the grating 112-1 or 112-2 may be omitted along with its corresponding detector 116-1 or 116-2, such that there is only a single grating 112 on a respective inner surface 106 of the optical homogenizer 104 and only a single detector 116 to receive light 114 diffracted by the grating 112 and measure the power of the received light 114. In still other alternatives, there are gratings 112 on more than two inner surfaces 106 of the optical homogenizer 104 and there are an equal number of corresponding detectors 116. In an example in which the tunnel 110 is rectangular, there may be four gratings 112, each on one of the inner surfaces 106, and four corresponding detectors 116. Each detector 116 receives light 114 diffracted by a respective grating 112 and measures the power of the received light 114. Having multiple gratings 112 on respective inner surfaces 106 of the tunnel 110 provides information about the power distribution of the light at the edges of the beam 102 and thus information about the effectiveness of the homogenization performed by the optical homogenizer 104.

Detectors may also be included to receive diffracted OOB light of particular wavelengths and to measure the power of the received OOB light of the particular wavelengths. For example, a detector may be added to the illumination system 100 to receive a particular wavelength of light in a diffraction order (e.g., the first diffraction order) of OOB light 118 and to measure the power of the light of that particular wavelength in that diffraction order.

Figure 2:
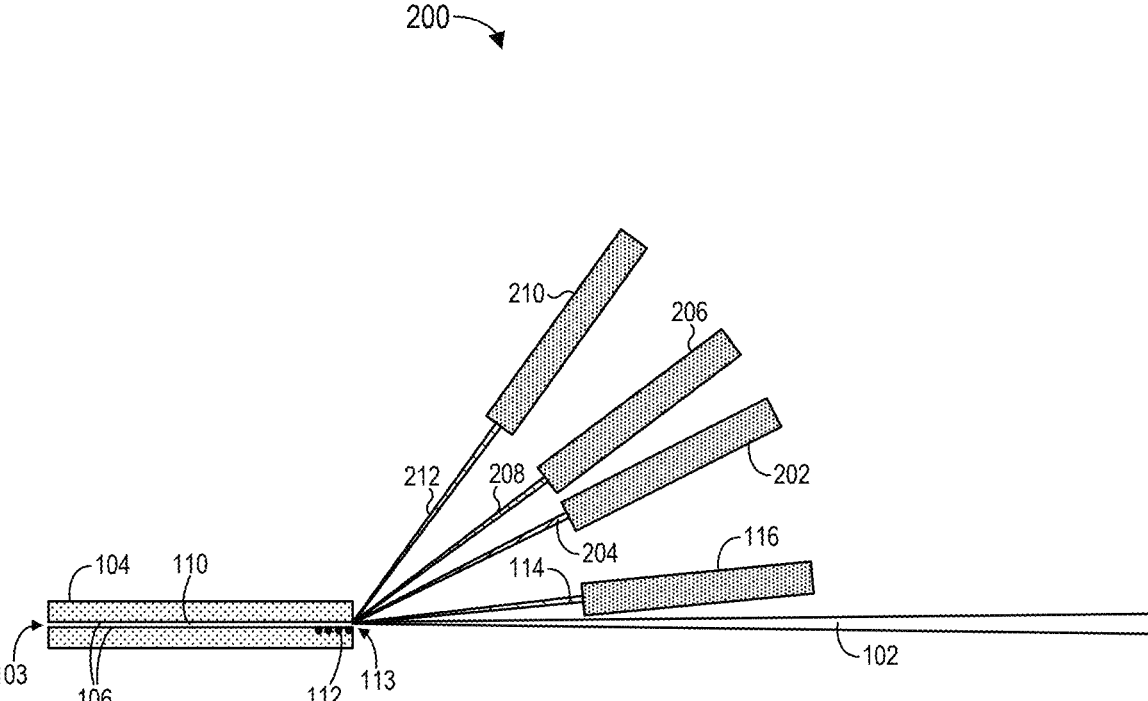
FIG. 2 shows a portion of an illumination system with an optical homogenizer, a grating, and detectors, in which both in-band and out-of-band light is diffracted and measured, in accordance with some embodiments.

FIG. 2 shows a portion of an illumination system 200 in which both IB EUV light 114 and OOB light are diffracted and their respective powers measured, in accordance with some embodiments. The IB EUV light, including both the IB EUV light in the main beam 102 and the diffracted IB EUV light 114, may have a wavelength of 13.5 nm. The illumination system 200 includes an optical homogenizer 104 with a grating 112 on an inner surface 106. The main beam 102 propagates through the tunnel 110, exits the second end 113 of the tunnel 110, and continues to propagate downstream. (The beam 102 enters the tunnel 110 of the optical homogenizer 104 at the first end 103; this entry of the beam 102 into the tunnel 110 is not shown in FIG. 2 for simplicity. The beam 102 is generated by a light source and directed to (e.g., focused into) the tunnel 110 by appropriate optics, which are also not shown.) The main beam 102 that exits the second end 113 of the tunnel 110 and continues to propagate downstream includes specular reflection (i.e., zeroth-order light) from the grating 112.

A detector 116 receives IB EUV light 114 diffracted by the grating 112 and measures the power of the received IB EUV light 114, as for the illumination system 100 (FIG. 1). In addition to the detector 116, the illumination system 200 includes detectors 202, 206, and 210 for detecting respective wavelengths of diffracted OOB light 204, 208, and 212 (e.g., of diffracted OOB light in the first diffraction order of the respective wavelengths). Because of the dispersive nature of the grating 112, different wavelengths of OOB light are diffracted at different angles from the plane of the grating 112. The diffracted OOB light may include ultraviolet, visual, and infrared light.

The detector 202 receives and measures the power of diffracted OOB light 204. The diffracted OOB light 204 has a longer wavelength and a larger diffraction angle than the diffracted IB EUV light 114. For example, the diffracted OOB light 204 is ultraviolet (e.g., with a 200 nm wavelength). The detector 206 receives and measures the power of diffracted OOB light 208. The diffracted OOB light 208 has a longer wavelength and a larger diffraction angle than the diffracted OOB light 204 and the diffracted IB EUV light 114. For example, the diffracted OOB light 208 is visual (e.g., with a 500 nm wavelength). The detector 210 receives and measures the power of diffracted OOB light 212. The diffracted OOB light 212 has a longer wavelength and a larger diffraction angle than the diffracted OOB light 208, the diffracted OOB light 204, and the diffracted IB EUV light 114. For example, the diffracted OOB light 212 is infrared (e.g., with a 1000 nm wavelength). The diffraction angles are measured with respect to the plane of the grating 112 (i.e., with respect to the side 106 on which the grating 112 is disposed). While the illumination system 200 is shown as having three detectors 202, 206, and 210 for respective wavelengths of OOB light, more or fewer detectors for respective wavelengths of OOB light may be present: the illumination system 200 may have only one or two such detectors or may have four or more such detectors. The detectors 202, 206, and 210 allow monitoring of the degree of spectral purity of the beam 102.

A grating may be located elsewhere in the path of a beam of light than in (e.g., on an inner surface 106 of) an optical homogenizer 104, with one or more detectors being positioned accordingly to receive and measure respective powers of light diffracted by the grating.

Figure 3:
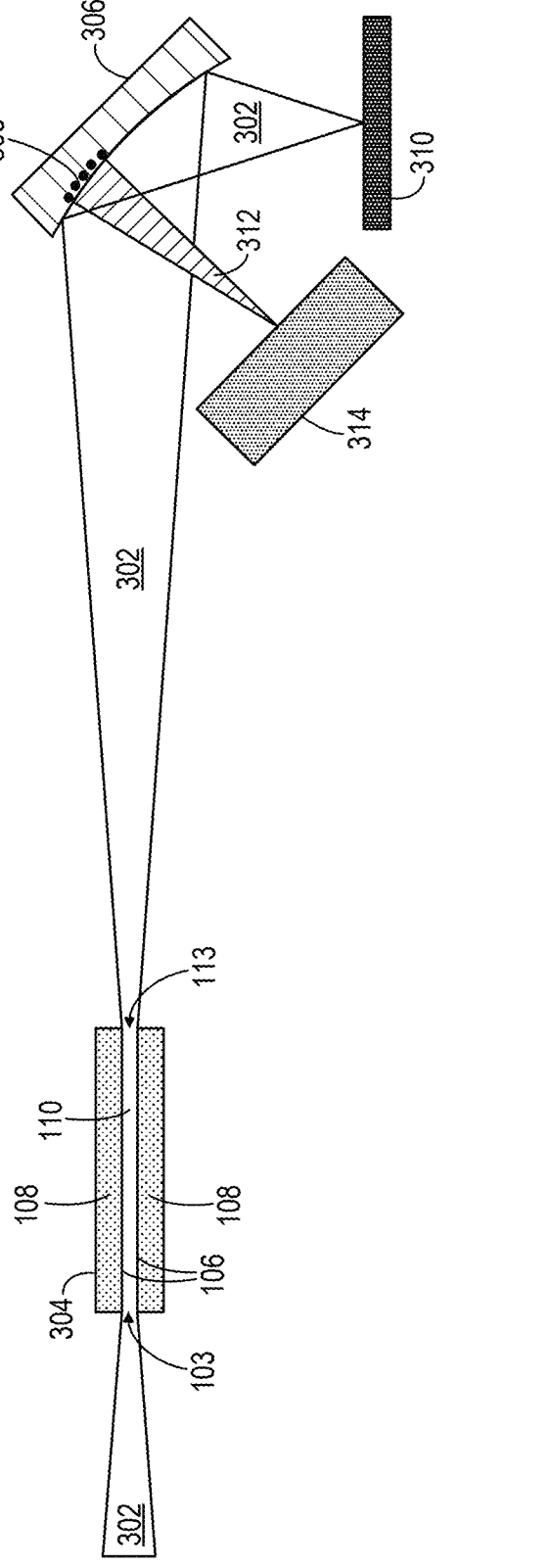
FIG. 3 shows a portion of an illumination system with an optical homogenizer, a focusing mirror with a grating on its surface, and a detector, in accordance with some embodiments.

FIG. 3 shows a portion of an illumination system 300 in accordance with some embodiments. The illumination system 300 includes an optical homogenizer 304 and a focusing mirror 306 used to illuminate a target 310. The target 310 may be, for example, a reticle or semiconductor wafer that is illuminated to be inspected for defects. In another example, the target 310 is a semiconductor wafer that is illuminated to expose the wafer during a photolithographic manufacturing process. The target may be disposed on a platform or chuck (not shown).

In an illumination path of the illumination system 300, a beam of light 302 is provided to the optical homogenizer 304, in the manner that the beam of light 102 is provided to the optical homogenizer 104 (FIGS. 1-2). The optical homogenizer 304 has the same structure as the optical homogenizer 104 except that no gratings are present on any of the inner surfaces 106 (or elsewhere in the path of the beam 302 through the tunnel 110). The beam 302 is unhomogenized upon entering the tunnel 110 of the optical homogenizer 304 at the first end 103 and is homogenized upon exiting the tunnel 110 of the optical homogenizer 304 at the second end 113.

In some embodiments, the beam 302 includes IB EUV light (e.g., with a 13.5 nm wavelength, for use in semiconductor processing or metrology), as generated by an EUV light source (not shown). The beam 302 may include OOB light (e.g., ultraviolet, visual, and infrared light) in addition to the IB EUV light. For example, the OOB light in the beam 302 may include OOB light with wavelengths ranging from approximately 50 nm to approximately 1000 nm.

A focusing mirror 306 is disposed in the path of the beam 302 between the optical homogenizer 304 and the target 310, to reflect the beam 302 and focus the beam 302 onto the target 310. The beam 302 as reflected and focused by the focusing mirror 306 is homogenized, because the focusing mirror 306 is downstream from the homogenizer 304. The focusing mirror 306 may include a stack of molybdenum/silicon bilayers with an Ru capping layer.

A grating 308 is disposed on a surface of the focusing mirror 306 in the path of the beam 302. The grating 308 may be fabricated on the surface of the focusing mirror 306 using subtractive or additive manufacturing (e.g., as described for the gratings 112-1 and 112-2, FIG. 1). The grating 308 extends across a portion but not the entirety of the surface of the focusing mirror 306, and across a portion but not the entirety of the path of the beam 302, in accordance with some embodiments. The extent of the grating 308 may be varied to reduce or increase the amount of light 312 diffracted by the grating 308, and thus to reduce or increase the amount of diffracted light 312 that reaches a detector 314.

The detector 314 is positioned to receive light 312 diffracted by the grating 308 and measure the power of the received light 312. The detector 314 samples the beam 302 at the pupil plane, whereas detectors 114 (e.g., detectors 114-1 and 114-2, FIG. 1) sample the beam 102 (FIGS. 1-2) at the field plane. Because of the dispersive nature of diffraction from the grating 308, the light 312 as received and measured by the detector 314 has high spectral purity. Accordingly, the detector 314 is implemented without positioning a spectral filter in front of it, in accordance with some embodiments. Alternatively, a filter may be disposed in front of the detector 314 to filter out stray light (e.g., stray OOB light).

The light 312 may be a first diffraction order of IB EUV light or another diffraction order of IB EUV light. The detector 314 may be a photodiode or other suitable optical sensor. The power of the received light 314 can be compared to an expected power value to determine whether the illumination system 300 is operating properly and can serve as feedback to adjust operation of the illumination system 300 (e.g., of the light source in the illumination system 300).

FIG. 3 shows the illumination system 300 as having a single detector 314. But in some embodiments, the illumination system 300 may include one or more additional detectors positioned to receive and measure respective powers of diffracted OOB light (e.g., of a first diffraction order of OOB light) of respective wavelengths.

Examples provided for the illumination systems 100, 200, and 300 (FIGS. 1-3) describe the IB light as being EUV light (e.g., 13.5 nm light). In other examples, the IB light may have other wavelengths. For example, the IB light may be soft x-rays, ultraviolet light (e.g., DUV or VUV), or visual light. The optical homogenizer 104 or 304 may be replaced with a different design of optical homogenizer suitable for the wavelength(s) in question. In some examples of visual IB light, the optical homogenizer 104 may be replaced with a glass rod with one or more gratings etched into its end.

The configuration of the illumination systems 100, 200, and 300 (FIGS. 1-3) avoids obstruction of the field plane at the second end 113 (i.e., the exit) of the homogenizer 104 (FIG. 1-2) or 304 (FIG. 3). Because the detector(s) (e.g., detectors 116-1 and/or 116-2, FIG. 1; detector 116, FIG. 2; detector 314, FIG. 3) do not intrude into the optical field of the beam, alignment tolerances are not overly demanding. Also, the power of the light sampled by diffraction (e.g., light 114-1 and/or 114-2, FIG. 1; light 114, FIG. 2; light 312, FIG. 3) can be tailored to achieve sufficient signal-to-noise ratio while holding irradiance on the detector at a level that at least partially mitigates detector degradation and contamination.

Figure 4:
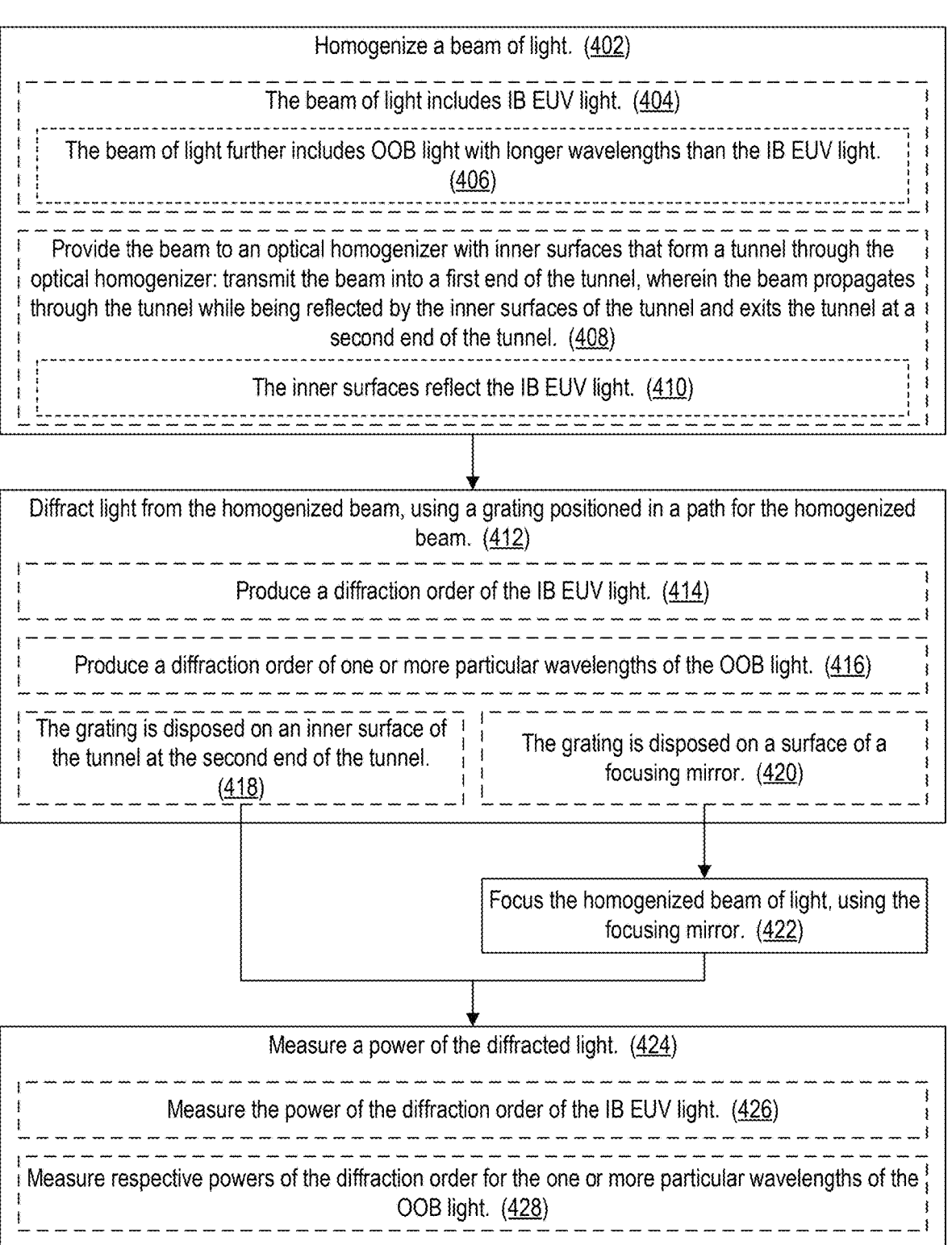
FIG. 4 is a flowchart showing an illumination method in accordance with some embodiments.

FIG. 4 is a flowchart showing an illumination method 400 in accordance with some embodiments. The illumination method 400 is performed, for example, in the illumination system 100 (FIG. 1), 200 (FIG. 2), or 300 (FIG. 3).

In the method 400, a beam of light (e.g., beam 102, FIGS. 1-2; beam 302, FIG. 3) is homogenized (402). In some embodiments, the beam of light includes (404) IB EUV light, and may further include (406) OOB light with longer wavelengths than the IB EUV light.

In some embodiments, to homogenize (402) the beam of light, the beam is provided (408) to an optical homogenizer (e.g., optical homogenizer 104, FIGS. 1-2; optical homogenizer 304, FIG. 3) with inner surfaces that form a tunnel through the optical homogenizer. The beam is transmitted into a first end of the tunnel, propagates through the tunnel while being reflected by the inner surfaces of the tunnel, and exits the tunnel at a second end of the tunnel. For example, the inner surfaces reflect (410) the IB EUV light, and may also reflect the OOB light.

Light is diffracted (412) from the homogenized beam, using a grating positioned in a path for the homogenized beam (e.g., grating 112-1 or 112-2, FIG. 1; grating 112, FIG. 2; grating 308, FIG. 3). In some embodiments, a diffraction order (e.g., the first diffraction order) of the IB EUV light (e.g., light 114-1 or 114-2, FIG. 1; light 114, FIG. 2; light 312, FIG. 3) is produced (414). A diffraction order (e.g., the first diffraction order) of one or more particular wavelengths of the OOB light (e.g., light 118, FIG. 1; light 204, 208, and/or 212, FIG. 2) may also be produced (416).

In some embodiments, the grating (e.g., grating 112-1 or 112-2, FIG. 1; grating 112, FIG. 2) is disposed (418) on an inner surface of the tunnel at the second end of the tunnel. The grating may be one of a plurality of gratings (e.g., gratings 112-1 and 112-2, FIG. 1), each of which is disposed on a respective inner surface of the tunnel. Each grating of the plurality of gratings diffracts light from the homogenized beam.

In some other embodiments, the grating (e.g., grating 308, FIG. 3) is disposed (420) on a surface of a focusing mirror (e.g., focusing mirror 306, FIG. 3). The homogenized beam of light (e.g., beam 302 downstream of the homogenizer 304, FIG. 3) is focused (422) using the focusing mirror. For example, the beam is focused onto a target (e.g., target 310, FIG. 3).

A power of the diffracted light is measured (424). In some embodiments, the power of the diffraction order (e.g., the first diffraction order) of the IB EUV light is measured (426) (e.g., using the detector 116-1 or 116-2, FIG. 1; the detector 116, FIG. 2, or the detector 314, FIG. 3). In addition, or alternatively, respective powers are measured (428) of the diffraction order (e.g., the first diffraction order) for the one or more particular wavelengths of the OOB light (e.g., using the detectors 202, 206, and/or 210, FIG. 3).

While the method 400 includes a number of steps shown to occur in a specific sequence, the steps can be performed in parallel. For example, all of the steps of the method 400 can be performed simultaneously in an ongoing manner.

The results of the method 400 (e.g., the measured power(s) of step 424) may be used to control operation of an illumination system that performs the method 400 (e.g., the illumination system 100, FIG. 1; 200, FIG. 2; or 300, FIG. 3). For example, the power of a light source that generates the beam of light may be adjusted based on the results of the method 400. In other examples, a warning may be generated and/or the illumination system (e.g., the light source in the illumination system) may be deactivated based on the results of the method 400 (e.g., if the measured power exceeds, or equals or exceeds, a threshold, thereby satisfying the threshold). The results of the method 400 may also or alternatively be used for downstream data processing (e.g., for correcting images taken using the illumination system that performs the method 400).

Figure 5:
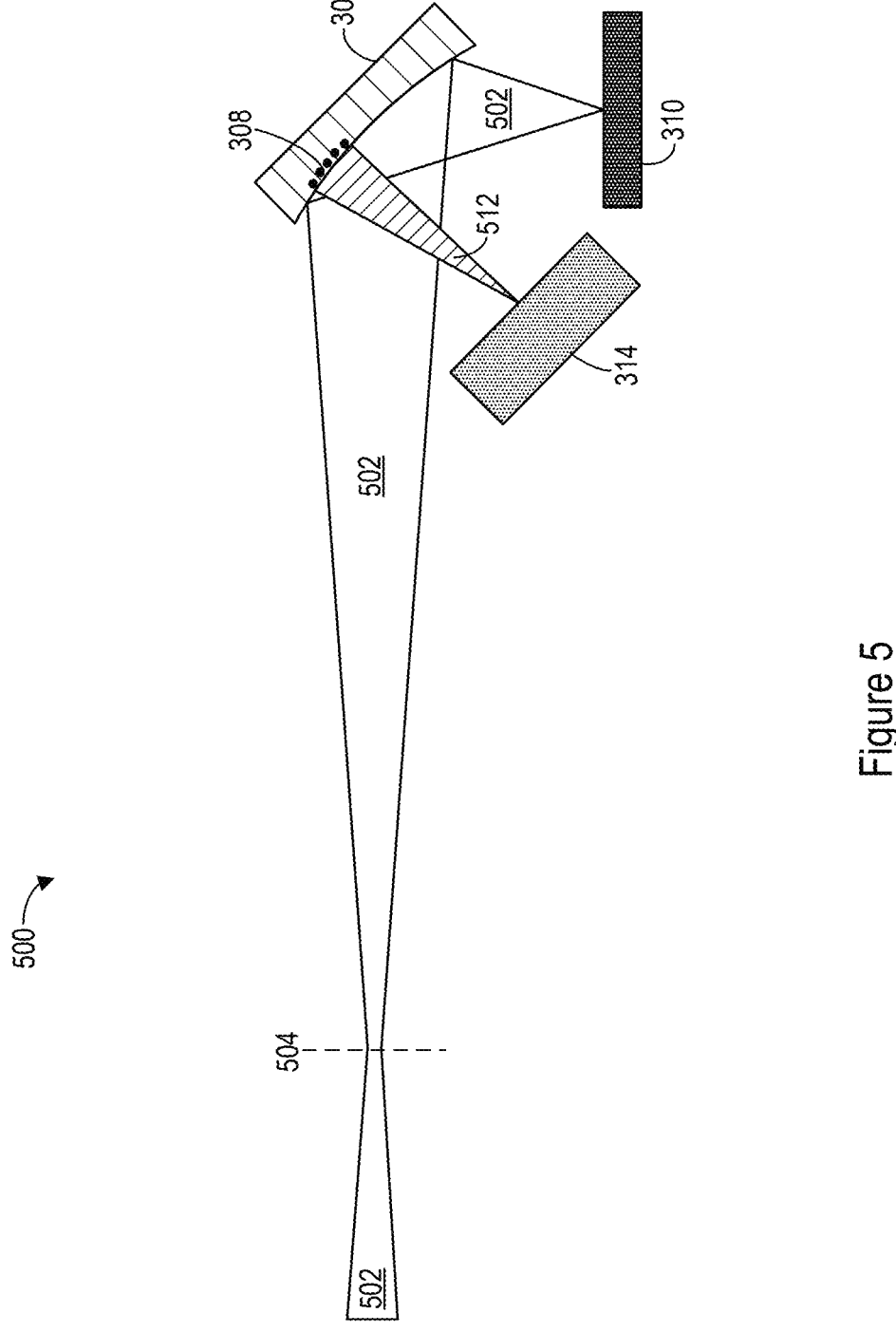
FIG. 5 shows a portion of an illumination system that includes a focusing mirror with a grating on its surface and also includes a detector, but does not include an optical homogenizer, in accordance with some embodiments.

FIG. 5 shows a portion of an illumination system 500 in accordance with some embodiments. The illumination system 500 includes the focusing mirror 306 (FIG. 3), which is used to illuminate a target 310 (FIG. 3) with a beam of light 502. The illumination system 500 does not, however, include the optical homogenizer 304 (FIG. 3). Instead, the beam of light 502 is unhomogenized. The illumination system 500 is used for critical illumination, which is illumination of the target 310 with an unhomogenized beam. For example, the light in the beam 502 has a Gaussian or Lorentzian energy distribution. The beam of light 502 has an intermediate focal plane 504 upstream from the focusing mirror 306.

The illumination system 500 further includes a grating 308 (FIG. 3) and a detector 314 (FIG. 3). The grating 308 is disposed on a surface of the focusing mirror 306 in the path of the beam 502. The detector 314 is positioned to receive light 512 diffracted by the grating 308 and measure the power of the received light 512. Because of the dispersive nature of diffraction from the grating 308, the light 512 as received and measured by the detector 314 has high spectral purity. Accordingly, the detector 314 can be implemented without positioning a spectral filter in front of it, in accordance with some embodiments. Alternatively, a filter may be disposed in front of the detector 314 to filter out stray light (e.g., stray OOB light).

The illumination system 500 allows for high spectral resolution, because the diffracted light 512 can be focused on the detector 314.

In some embodiments, the beam 502 includes IB EUV light (e.g., with a 13.5 nm wavelength, for use in semiconductor processing or metrology), as generated by an EUV light source (not shown). The light 512 may be a particular diffraction order (e.g., the first diffraction order) of the IB EUV light. The focusing mirror 306 is reflective of the IB EUV light. The beam 502 may include OOB light (e.g., ultraviolet, visual, and infrared light) in addition to the IB EUV light. For example, the OOB light in the beam 502 may include OOB light with wavelengths ranging from approximately 50 nm to approximately 1000 nm. The focusing mirror 306 may also be reflective of the OOB light.

In other embodiments, the IB light of the beam 502 has other wavelengths. For example, the IB light may be soft x-rays, ultraviolet light (e.g., DUV or VUV), or visual light.

The power of the received light 512 can be compared to an expected power value to determine whether the illumination system 500 is operating properly and can serve as feedback to control operation of the illumination system 500 (e.g., of the light source in the illumination system 500 that generates the beam 502).

FIG. 5 shows the illumination system 500 as having a single detector 314. But in some embodiments, the illumination system 500 may include one or more additional detectors positioned to receive and measure respective powers of diffracted OOB light (e.g., of a first diffraction order of OOB light) of respective wavelengths.

Figure 6:
FIG. 6 is a flowchart showing an illumination method in accordance with some embodiments.
Figure 6:
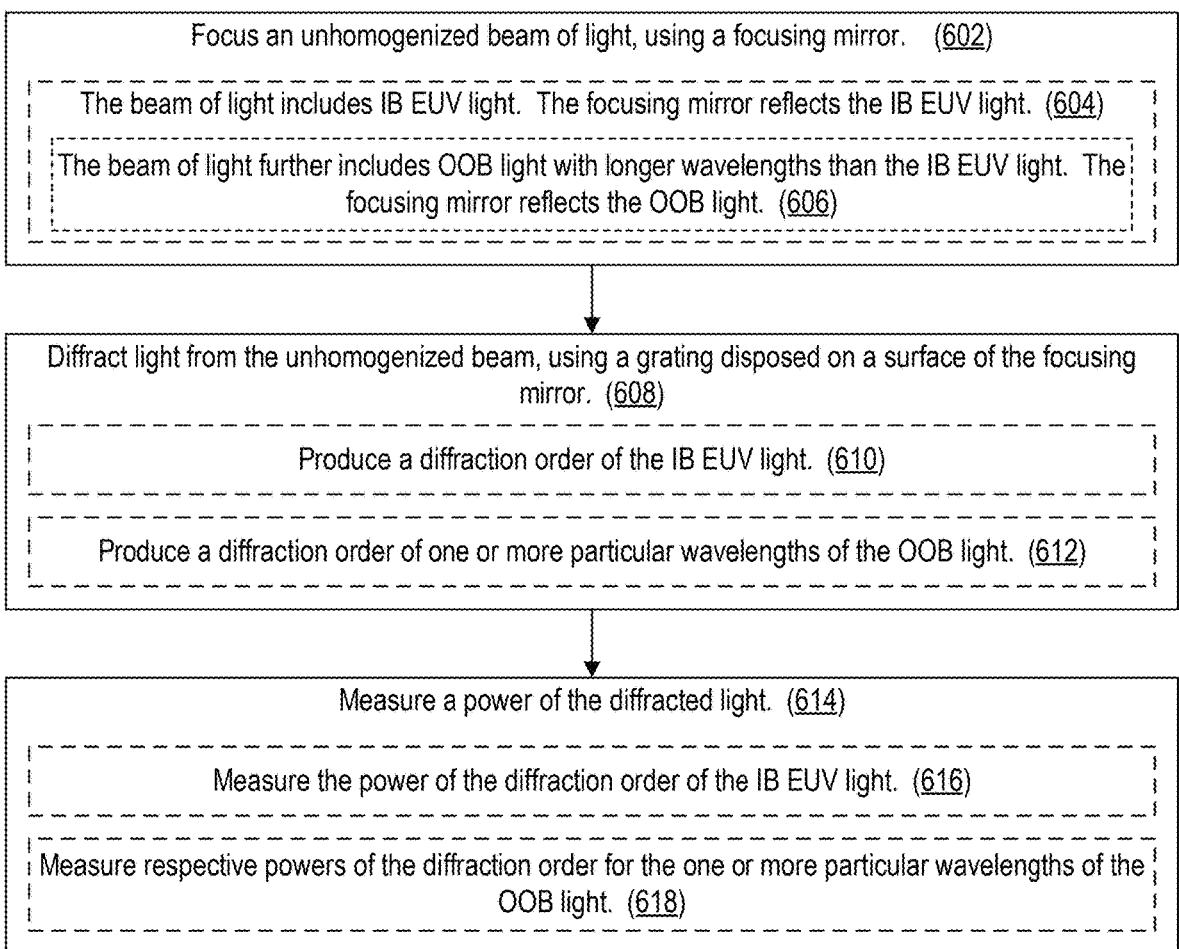

FIG. 6 is a flowchart showing an illumination method 600 in accordance with some embodiments. The illumination method 600 is performed, for example, in the illumination system 500 (FIG. 5).

In the illumination method 600, an unhomogenized beam of light (e.g., beam 502, FIG. 5) is focused (602) using a focusing mirror (e.g., focusing mirror 306, FIG. 5). For example, the beam is focused onto a target (e.g., target 310, FIG. 5). In some embodiments, the beam of light includes (604) IB EUV light. The focusing mirror reflects the IB EUV light. The beam of light may further include (606) OOB light with longer wavelengths than the IB EUV light. The focusing mirror may reflect the OOB light.

Light is diffracted (608) from the unhomogenized beam, using a grating disposed on a surface of the focusing mirror (e.g., grating 308, FIG. 5). In some embodiments, a diffraction order (e.g., the first diffraction order) of the IB EUV light (e.g., light 512, FIG. 5) is produced (610). If OOB light is included in the beam of light, a diffraction order (e.g., the first diffraction order) of the OOB light is also produced. Producing this diffraction order of the OOB light includes producing (612) this diffraction order for one or more particular wavelengths of the OOB light.

A power of the diffracted light is measured (614) (e.g., by the detector 314, FIG. 5). In some embodiments, the power of the diffraction order (e.g., the first diffraction order) of the IB EUV light is measured (616) (e.g., using the detector 314, FIG. 5). Respective powers of the diffraction order (e.g., the first diffraction order) for the one or more particular wavelengths of the OOB light may also or alternatively be measured (618) (e.g., using respective detectors positioned to receive light of the particular wavelengths).

While the method 600 includes a number of steps shown to occur in a specific sequence, the steps can be performed in parallel. For example, all of the steps of the method 600 can be performed simultaneously in an ongoing manner.

The results of the method 600 (e.g., the measured power(s) of step 614) may be used to control operation of an illumination system that performs the method 600 (e.g., the illumination system 500, FIG. 5). For example, the power of a light source that generates the beam of light may be adjusted based on the results of the method 600. In other examples, a warning may be generated and/or the illumination system (e.g., the light source in the illumination system) may be deactivated based on the results of the method 600. The results of the method 600 may also or alternatively be used for downstream data processing (e.g., for correcting images taken using the illumination system that performs the method 600).

Controlling operation of an illumination system (e.g., illumination system 100, 200, 300, or 500, FIG. 1-3 or 5) may be achieved by communicatively coupling one or more detectors that measure the power of diffracted light (e.g., detectors 116-1 and/or 116-2, FIG. 1; detectors 116, 202, 206, and/or 210, FIG. 2; detector 314, FIG. 3 or 5) with a controller. The power measurement(s) are provided from the one or more detectors as feedback to the controller. The controller may adjust or stop operation of the illumination system and/or generate warning messages based on this feedback. For example, the controller is communicatively coupled to a light source and may adjust the power of light provided by the light source based on this feedback, or may deactivate the light source based on this feedback (e.g., if the measured power satisfies a threshold).

To perform downstream data processing, one or more detectors that measure the power of diffracted light (e.g., detectors 116-1 and/or 116-2, FIG. 1; detectors 116, 202, 206, and/or 210, FIG. 2; detector 314, FIG. 3 or 5) are communicatively coupled with a computer system that performs the data processing using the measured power of diffracted light (e.g., that uses the measured power of diffracted light for image correction). The computer system includes one or more processors and memory storing instructions, configured for execution by the one or more processors, for performing the data processing (e.g., image correction) using the measured power of diffracted light.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An illumination system, comprising:

an optical homogenizer to homogenize a beam of light;

a grating positioned in a path for the homogenized beam of light, to diffract light from the homogenized beam; and a detector to receive light diffracted by the grating and to measure a power of the received light.

2. The illumination system of claim 1, wherein:

the optical homogenizer comprises inner surfaces forming a tunnel through the optical homogenizer, the inner surfaces being reflective to reflect the light in the beam;

the beam of light is to enter a first end of the tunnel, propagate through the tunnel, and exit a second end of the tunnel; and the grating is disposed on an inner surface of the tunnel at the second end of the tunnel.

3. The illumination system of claim 2, wherein:

the tunnel is a rectangular tunnel having four inner surfaces;

the grating is a first grating disposed on a first inner surface of the tunnel at the second end of the tunnel;

the detector is a first detector to receive light diffracted by the first grating and to measure a power of the received light diffracted by the first grating; and the illumination system further comprises:

a second grating disposed on a second inner surface of the tunnel at the second end of the tunnel, to diffract light from the beam; and a second detector to receive light diffracted by the second grating and to measure a power of the received light diffracted by the second grating.

4. The illumination system of claim 2, wherein:

the beam of light comprises in-band (IB) extreme ultraviolet (EUV) light; and the inner surfaces of the optical homogenizer are reflective of the IB EUV light.

5. The illumination system of claim 4, wherein:

the light diffracted by the grating comprises a diffraction order of the IB EUV light;

the detector is positioned to receive the diffraction order of the IB EUV light; and the detector is to measure a power of the received diffraction order of the IB EUV light.

6. The illumination system of claim 5, wherein:

the detector is a first detector;

the beam of light further comprises out-of-band (OOB) light having longer wavelengths than the IB EUV light;

the light diffracted by the grating further comprises a diffraction order of a particular wavelength of the OOB light; and the illumination system further comprises a second detector positioned to receive the diffraction order of the particular wavelength of the OOB light, wherein the second detector is to measure a power of the received diffraction order of the particular wavelength of the OOB light.

7. The illumination system of claim 6, wherein:

the particular wavelength of the OOB light is ultraviolet;

the light diffracted by the grating further comprises a diffraction order of a visual wavelength of the OOB light; and the illumination system further comprises a third detector positioned to receive the diffraction order of the visual wavelength of the OOB light, wherein the third detector is to measure a power of the received diffraction order of the visual wavelength of the OOB light.

8. The illumination system of claim 1, further comprising a focusing mirror to focus the beam of light, as homogenized by the optical homogenizer, wherein the grating is disposed on a surface of the focusing mirror.

9. The illumination system of claim 8, wherein:

the optical homogenizer comprises inner surfaces forming a tunnel through the homogenizer, the inner surfaces being reflective to reflect the light in the beam; and the beam of light is to enter a first end of the tunnel, propagate through the tunnel, and exit a second end of the tunnel.

10. The illumination system of claim 9, wherein:

the beam of light comprises in-band (IB) extreme ultraviolet (EUV) light; and the inner surfaces of the optical homogenizer are reflective of the IB EUV light.

11. The illumination system of claim 10, wherein:

the light diffracted by the grating comprises a diffraction order of the IB EUV light;

the detector is positioned to receive the diffraction order of the IB EUV light; and the detector is to measure a power of the received diffraction order of the IB EUV light.

12. The illumination system of claim 8, wherein:

the beam of light comprises in-band (IB) extreme ultraviolet (EUV) light;

the light diffracted by the grating comprises a diffraction order of the IB EUV light;

the detector is positioned to receive the diffraction order of the IB EUV light; and the detector is to measure a power of the received diffraction order of the IB EUV light.

13. A method, comprising:

homogenizing a beam of light;

diffracting light from the homogenized beam, using a grating positioned in a path for the homogenized beam; and measuring a power of the diffracted light.

14. The method of claim 13, wherein:

homogenizing the beam comprises providing the beam to an optical homogenizer comprising inner surfaces forming a tunnel through the optical homogenizer;

providing the beam to the optical homogenizer comprises transmitting the beam into a first end of the tunnel, wherein the beam propagates through the tunnel while being reflected by the inner surfaces of the tunnel and exits the tunnel at a second end of the tunnel; and the grating is disposed on an inner surface of the tunnel at the second end of the tunnel.

15. The method of claim 14, wherein:

the beam of light comprises in-band (IB) extreme ultraviolet (EUV) light;

the inner surfaces of the optical homogenizer reflect the IB EUV light;

the diffracting comprises producing a diffraction order of the IB EUV light; and the measuring comprises measuring a power of the diffraction order of the IB EUV light.

16. The method of claim 15, wherein:

the beam of light further comprises out-of-band (OOB) light having longer wavelengths than the IB EUV light;

the diffracting further comprises producing a diffraction order of a particular wavelength of the OOB light; and the measuring further comprises measuring a power of the diffraction order of the particular wavelength of the OOB light.

17. The method of claim 13, further comprising focusing the homogenized beam of light, using a focusing mirror, wherein the grating is disposed on a surface of the focusing mirror.

18. The method of claim 17, wherein:

homogenizing the beam comprises providing the beam to an optical homogenizer comprising inner surfaces forming a tunnel through the optical homogenizer;

providing the beam to the optical homogenizer comprises transmitting the beam into a first end of the tunnel, wherein the beam propagates through the tunnel while being reflected by the inner surfaces of the tunnel and exits the tunnel at a second end of the tunnel;

the beam comprises in-band (IB) extreme ultraviolet (EUV) light;

the inner surfaces of the optical homogenizer reflect the IB EUV light;

the diffracting comprises producing a diffraction order of the IB EUV light; and the measuring comprises measuring a power of the diffraction order of the IB EUV light.

19. An illumination system, comprising:

a focusing mirror to focus an unhomogenized beam of light;

a grating, disposed on a surface of the focusing mirror, to diffract light from the beam; and a detector to receive light diffracted by the grating and to measure a power of the received light.

20. The illumination system of claim 19, wherein:

the beam of light comprises in-band (IB) extreme ultraviolet (EUV) light; and the focusing mirror is reflective of the IB EUV light.

* * * * *